(12) United States Patent
Woodell et al.

(10) Patent No.: US 7,714,743 B1
(45) Date of Patent: May 11, 2010

(54) AIRCRAFT LIGHTNING STRIKE DETECTOR

(75) Inventors: Daniel L. Woodell, Cedar Rapids, IA (US); Terrence P. Wey, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 294 days.

(21) Appl. No.: 11/900,951

(22) Filed: Sep. 14, 2007

(51) Int. Cl.
*G08B 21/00* (2006.01)

(52) U.S. Cl. ............... 340/945; 340/963; 73/170.16; 73/170.24; 342/26 B; 702/4; 324/72

(58) Field of Classification Search ........... 340/945, 340/952, 957, 963; 342/72, 26 B, 26 R, 175, 342/176, 181, 182, 450, 451, 460; 324/76.19, 324/658, 72; 73/170.16, 170.24; 702/1, 702/2, 3, 4

See application file for complete search history.

(56) References Cited

U.S. PATENT DOCUMENTS

| | | | |
|---|---|---|---|
| 3,967,280 A | 6/1976 | Mayer et al. | 342/434 |
| 4,023,408 A | 5/1977 | Ryan et al. | 73/170.24 |
| 4,156,182 A * | 5/1979 | Brick et al. | 324/72 |
| 5,331,330 A * | 7/1994 | Susnjara | 342/460 |
| 6,586,920 B1 * | 7/2003 | Hirakawa | 324/72 |
| 6,606,564 B2 * | 8/2003 | Schwinn et al. | 702/4 |
| 7,218,123 B1 * | 5/2007 | Tsamis et al. | 324/658 |
| 7,515,087 B1 * | 4/2009 | Woodell et al. | 342/26 B |

\* cited by examiner

*Primary Examiner*—Toan N Pham
(74) *Attorney, Agent, or Firm*—Matthew J. Evans; Daniel M. Barbieri

(57) ABSTRACT

An aircraft lightning event detector includes a sensor mounted to an aircraft. The sensor determines whether a lightning event has struck the aircraft or induced a possibly damaging current into the aircraft. A threshold mechanism determines whether the sensed lightning event is greater than a predetermined size. A memory stores a record of the sensed lightning event for post-flight maintenance analysis when the lightning event is greater than the predetermined size.

16 Claims, 3 Drawing Sheets

AIRCRAFT LIGHTNING STRIKE DETECTOR

FIELD OF THE INVENTION

The present invention relates generally to the field of avionics, and more particularly, to the detecting of lightning strikes on or near an aircraft.

BACKGROUND OF THE INVENTION

Lightning strikes of a plane can be a serious safety concern. Not only are high electrical currents directly dangerous to passengers and crew of the aircraft, but a lightning strike can damage or destroy the electrical and mechanical components of the aircraft, including sensitive avionics equipment. Because of this danger, commercial aircraft pilots tend to avoid flying through weather events that could cause lightning strikes. However, aircraft still encounter lightning, and its danger is undiminished. Because of such danger a pilot typically reports any observed lightning that contacts or is even adjacent the aircraft. After the flight, maintenance personnel conduct a visual inspection of the aircraft to determine whether the aircraft was actually struck by lightning, and note where the lightning entered and exited the plane.

One drawback to this after-action approach to lightning safety is that an aircraft pilot, traveling at cruising speed for the aircraft, may have merely observed a nearby lightning flash and may not know whether lightning actually struck the aircraft. Nevertheless, a lightning strike report is typically given to the on-ground maintenance crew to search for visible damage. This potentially time-consuming activity does not need to be done if an observed lightning strike has not actually struck the aircraft. Furthermore, because a lightning strike is instantaneous and because the aircraft pilot cannot observe the entire surface of the aircraft, a pilot may not have noticed a lightning strike that may have damaged the aircraft. Lastly, some lightning strikes are not powerful enough to destroy or permanently damage avionics equipment, but have sufficient power to temporarily upset the avionics equipment. If such upset equipment recovers and operates normally after the lightning strike, it is time-consuming and expensive to remove and fully test the equipment after the flight.

It is therefore an object of the invention to accurately detect when lightning has either struck an aircraft or a close lightning discharge has induced a damaging current into the aircraft structure or aircraft's electrical equipment system. Since peak lighting currents typically exceed 200 kiloamps with rise times in the 50 kiloamps per microsecond, lightning events that influence the aircraft and its electronic suite are very detectable. There is also a need to identify the portions of the airframe that may have been struck by lightning to reduce the amount of time needed for maintenance personnel to inspect possible airframe damage locations. In addition to the damage induced in the aircraft or its systems by lightning, lightning may also induce temporary failures or momentary upsets in aircraft equipment whether lightning is identified as the primary cause of the failure event or not. Identifying the failure or equipment upset as lightning induced can reduce the number of maintenance actions on equipment that do not need removal and repair.

Another object of the invention is to determine whether the strength of a lightning strike to an aircraft or an induced current from a nearby lightning strike is sufficient to require maintenance operations to electronic equipment on the aircraft.

A feature of the invention is an AC-coupled magnetic field detector, mounted to the exterior or in the radome of the aircraft, that measures the strength of change in magnetic fields with respect to time that are induced by either direct lightning strikes or nearby lightning events.

An advantage of the invention is that lightning induced events that potentially influence and aircraft or its systems can be accurately detected, measured, reported, and recorded for later maintenance use.

SUMMARY OF THE INVENTION

The invention provides an aircraft lightning event detector. A sensor is mounted to an aircraft. The sensor determines whether a lightning event has struck the aircraft or induced a possibly damaging current into the aircraft. A threshold mechanism determines whether a sensed lightning event is greater than a predetermined size. A memory stores a record of the sensed lightning event for post-flight maintenance analysis when the lightning event is greater than the predetermined size.

The invention also provides an aircraft lightning maintenance system. An AC-coupled magnetic field detector is mounted to an exterior of an aircraft. A threshold mechanism determines whether a lightning event proximal the aircraft exceeds a predetermined size. A recording mechanism stores a record of the sensed lightning event for post-flight aircraft maintenance analysis when the lightning event is greater than the predetermined size. An alerting mechanism alerts a pilot of the aircraft to a lightning event that is greater than the predetermined size.

The invention further provides a method for detecting lightning events proximal an aircraft. According to the method, a rate of change in magnetic field strength versus time, corresponding to a lightning event proximal an aircraft. It is determined whether the rate of change in magnetic field strength versus time is greater than a predetermined threshold. The rate of change in magnetic field strength versus time is recorded for post-flight analysis when said rate of change is greater than the predetermined threshold. A pilot of the aircraft is alerted to the lightning event corresponding to the rate of change in magnetic field strength versus time that is greater than the predetermined threshold.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE DRAWINGS

Reference will now be made in detail to the presently preferred embodiments of the invention, examples of which are illustrated in the accompanying drawings. It is to be appreciated that corresponding reference numbers refer to generally corresponding structures.

Figure 1:
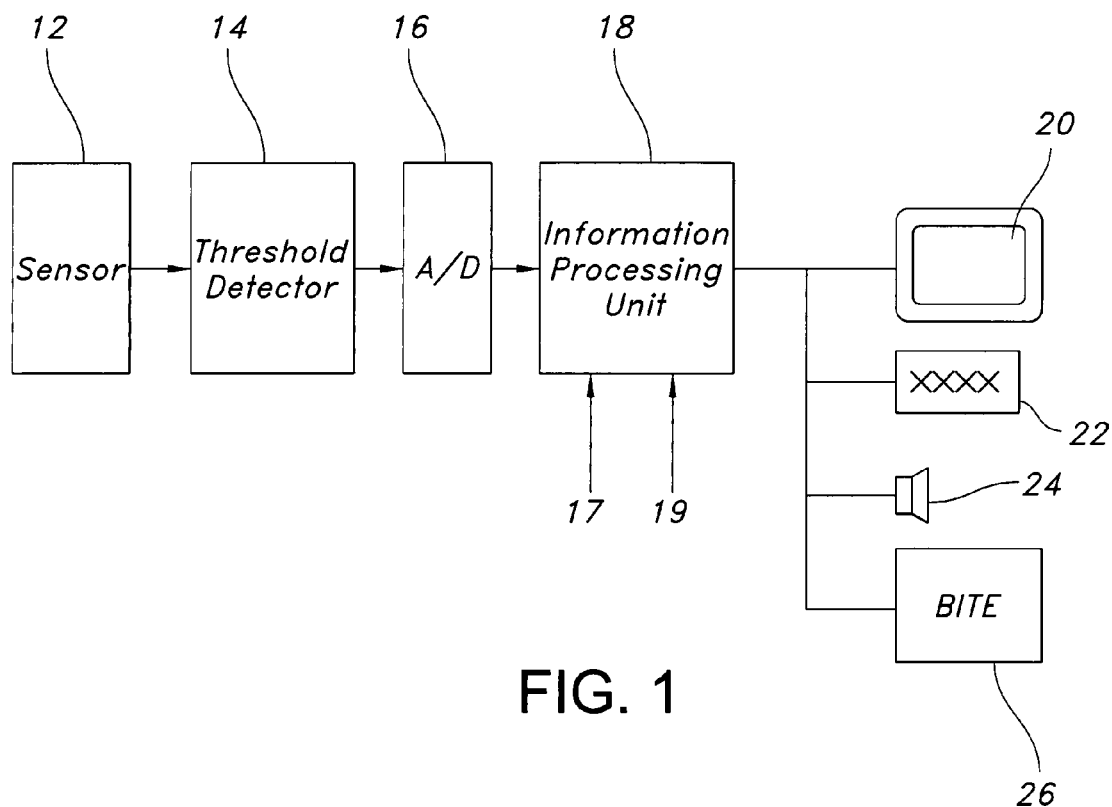
FIG. 1 is a block diagram according to an embodiment of the invention.
Figure 2:
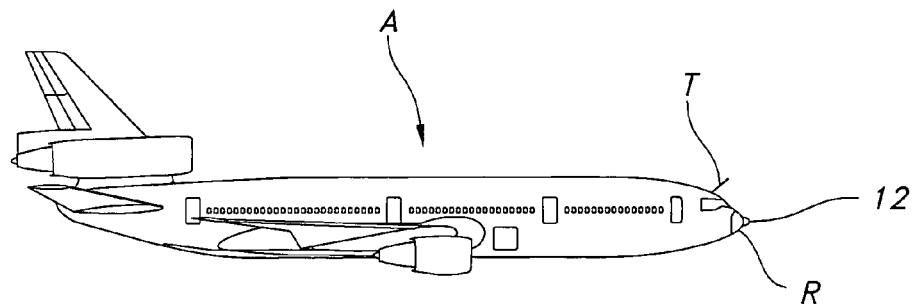
FIG. 2 is a side elevational view of an aircraft configured to implement the invention.

FIG. 1 is a schematic diagram of an aircraft lightning detection system 10 according to the invention. The components of system 10 are described with sufficient detail to enable one of ordinary skill in the relevant electronic arts to make and use the components as described herein. System 10 includes a sensor 12 that is mounted on an outer portion of an aircraft A, as shown in FIG. 2. For example, sensor 12 may be mounted in the radome R of aircraft A, or alternatively may be associated with an antenna T extending from the surface of the aircraft. The sensor is configured to infer large changes in electrical current on the outer surface or the electrical system of the aircraft, and in a preferred embodiment the sensor is an AC-coupled magnetic field detector that detects the magnetic field induced by the large currents with rapid rise times produced by lightning events. As used herein, a lightning event can be a direct lightning strike or lightning that does not strike the aircraft but is proximal or close enough to induce a large current into the aircraft or its electrical system. Returning to FIG. 1, sensor 12 sends to a threshold detector 14 an electrical signal proportionate in strength to a sensed lightning strike. Threshold detector 14 determines whether the electrical signal from the sensor represents an electrical event, such as a lightning strike or other lightning event, that needs to be memorialized or otherwise noted. If so, the threshold detector sends the signal through an analog-to-digital converter 16, and the digitized signal is further processed by an information processing unit 18, which may be a computer processor. The information processing unit processes the signal for to be recorded or communicated with aircraft personnel. To accurately capture the geographic location of detected lightning events, processor 18 receives aircraft state or situational inputs 17 such as date, time, latitude, altitude, and other parameters, as received from other sensors and processors onboard or remote from the aircraft. Processor 18 also receives inputs 19 from other lightning detection systems onboard or remote from the aircraft to verify the possibility of a lightning event. Inputs 18 and 19 are merged with the digitized signal from analog-to-digital converter 16 by processor 18. For example, the information processing unit may alert the aircraft pilot or co-pilot whether the plane has just been struck by lightning. Such an alert may be provided graphically or textually on a graphics display 20 or on a text-only output device 22. Alternatively, the alert may be provided through an audio system 24, which may provide a verbal or a non-verbal audio alert of a lightning strike. In addition or in lieu of a warning to the pilot and/or copilot of the aircraft, information processing unit 18 may send a message to be logged into and stored in built-in test equipment (BITE) 26 in the aircraft. Ground-based maintenance personnel can then analyze the stored information, which may also include the data from inputs 17 and 19, to determine information about the potential lightning event influencing the aircraft. Such analysis may include determining whether the lightning event was sufficient to require inspection of various mechanical or electrical components of the aircraft.

Figure 3:
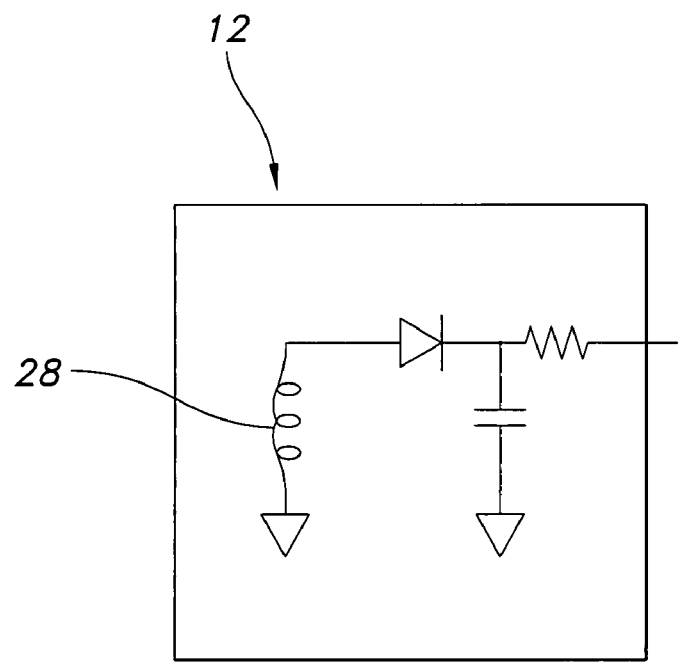
FIG. 3 is a schematic diagram of a lightning sensor according to an embodiment of the invention.
Figure 4:
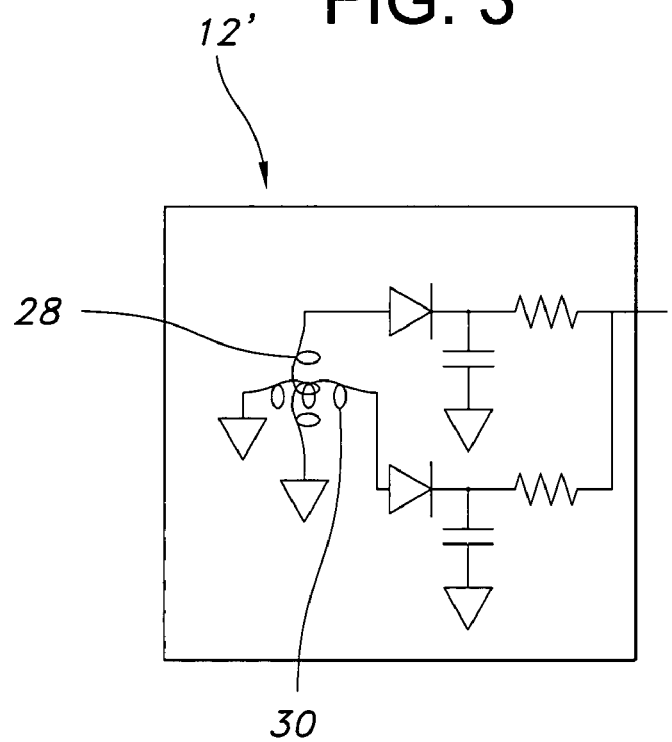
FIG. 4 is a schematic diagram of a lightning sensor according to another embodiment of the invention.
Figure 5:
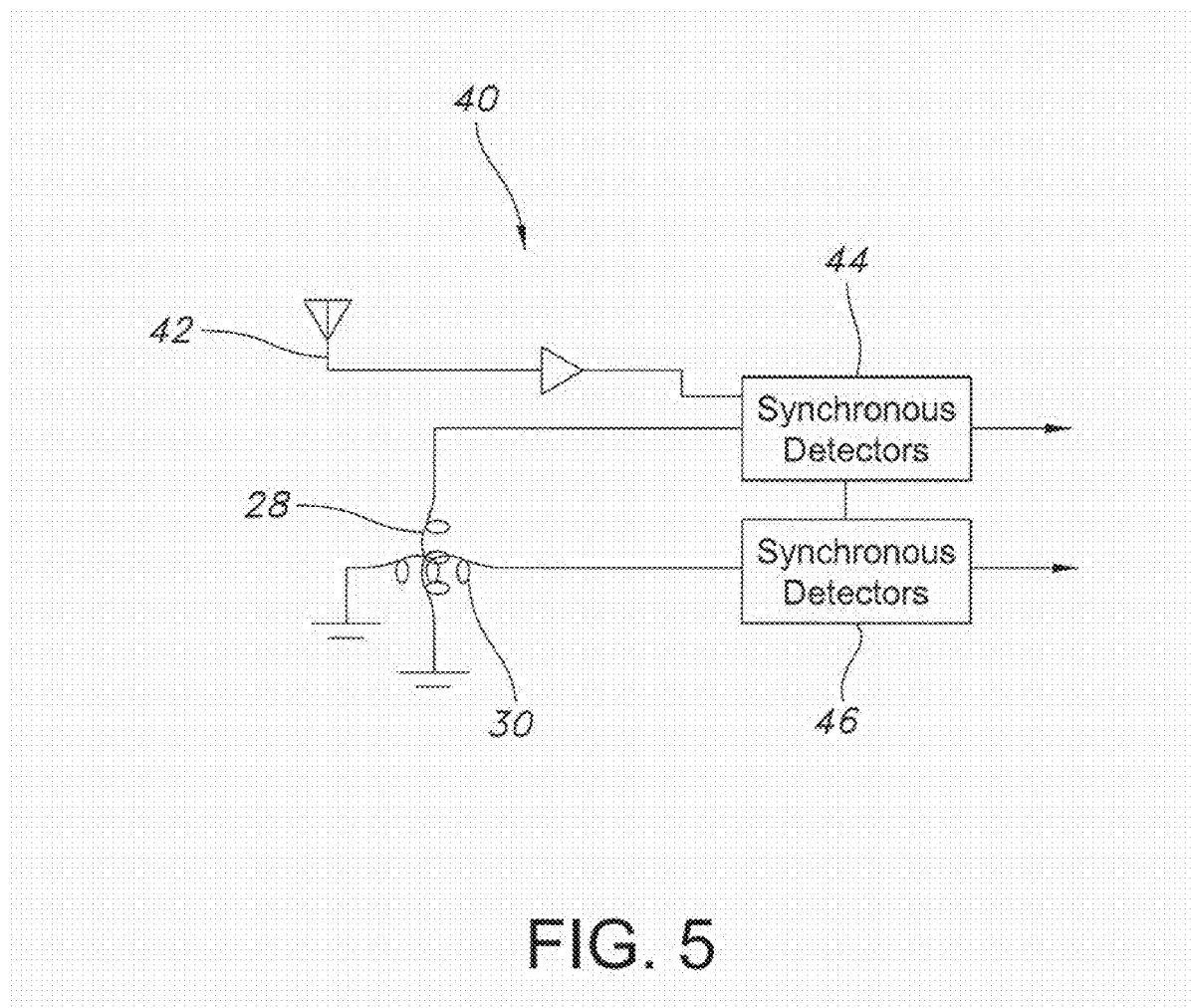
FIG. 5 is a schematic diagram of a lightning sensor according to still another embodiment of the invention.

FIG. 3 shows one embodiment of sensor 12. The sensor is an AC-coupled magnetic field detector, including an inductive coil 28 that detects changes in magnetic fields associated with lightning events. The change, or the time-rate change, in the strength of the magnetic field due to a lightning event is a function of the strength of the lightning event as well as its proximity to the aircraft. Therefore, a strong signal detected by the sensor equates to a nearby and/or strong lightning event that is more relevant to the safety or operation of the aircraft. FIG. 4 depicts another embodiment of sensor 12'. An second inductive coil 30 is positioned orthogonal to inductive coil 28, and together the inductive coils 28 and 30 provide a direction-finding function to the lightning sensor. The mounting of the coils is preferably such that the direction-finding capability of sensor 12' is front-to-back and left-to-right on the aircraft. In addition, some installations may require a third channel to remove the 180 degree ambiguity inherent in any magnetic pointing system. This added channels could take the form of a sense antenna, such as that shown in FIG. 5 at reference number 42. Sense antenna 42 forms part of sensor 40, which also includes orthogonally oriented inductive coils 28, 30. Signals from the sense antenna are combined with signals from the inductive coils using synchronous detectors 44, 46. The angle of incidence of the lightning event can thereby be deduced using known trigonometric functions. Such direction-finding sensors as disclosed herein makes it easier for maintenance personnel to determine where the aircraft may have been struck by the lightning strike. Although the disclosure describes three specific constructions for a lightning sensor it is to be understood that the scope of the invention is broad enough to cover any architecture of a lightning sensor that uses an AC-coupled magnetic field detector therein.

An advantage of the invention is that lightning events proximal an aircraft are more easily verifiable. This reduces costly post-flight inspections and unnecessary equipment removal after an incorrectly perceived lightning event.

Another advantage is that the invention may be made with relatively inexpensive circuitry. The overall cost of the invention is relatively low. Furthermore, because of the invention's simplicity, the time and cost of certifying the invention for use on commercial aircraft is anticipated to be low as well.

Still another advantage is that in at least one of the disclosed embodiments, the direction of the lightning strike relative to the plane can be determined. This may assist in locating lightning damage on the plane.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. An aircraft lightning event detector, comprising:
   a sensor mounted to an aircraft, the sensor determining whether a lightning event has struck the aircraft or induced a possibly damaging current into the aircraft;
   a threshold mechanism that determines whether the sensed lightning event is greater than a predetermined size; and
   a memory that stores a record of the sensed lightning event for post-flight maintenance analysis when the lightning event is greater than the predetermined size,
   wherein the sensor is an AC-coupled magnetic field detector including two orthogonally oriented coils to thereby sense a location on the aircraft of the lightning event.

2. The aircraft lightning event detector of claim 1, wherein the sensor is mounted in the radome of the aircraft.

3. The aircraft lightning event detector of claim 1, wherein the AC-coupled magnetic field detector further includes a sense line antenna.

4. The aircraft lightning event detector of claim 1, wherein the memory comprises a non-volatile memory storage unit.

5. The aircraft lightning event detector of claim 1, wherein the memory comprises a built-in test equipment (BITE) unit.

6. The aircraft lightning event detector of claim 1, further comprising a visual display to alert a pilot of the aircraft to the lightning event that is greater than the predetermined size.

7. The aircraft lightning event detector of claim 1, further comprising an audio speaker to alert a pilot of the aircraft to the lightning event that is greater than the predetermined size.

8. An aircraft lightning maintenance system, comprising:
   an AC-coupled magnetic field detector mounted to an exterior of an aircraft, the AC-coupled magnetic field detector including two orthogonally oriented coils to thereby sense a location on the aircraft of a lightning event;
   a threshold mechanism that determines whether a lightning event proximal the aircraft exceeds a predetermined size;
   a recording mechanism that stores a record of the sensed lightning event for post-flight aircraft maintenance analysis when the lightning event is greater than the predetermined size; and
   an alerting mechanism that alerts a pilot of the aircraft to the lightning event that is greater than the predetermined size.

9. The aircraft lightning maintenance system of claim 8, wherein the alerting mechanism is one of a visual display and an audio speaker.

10. The aircraft lightning maintenance system of claim 8, wherein the recording mechanism comprises a non-volatile memory storage unit.

11. The aircraft lightning maintenance system of claim 8, wherein the recording mechanism comprises a built-in test equipment (BITE) unit.

12. The aircraft lightning maintenance system of claim 8, wherein the AC-coupled magnetic field detector further includes a sense line antenna.

13. The aircraft lightning maintenance system of claim 8, wherein the recording mechanism further stores aircraft state data to accurately capture a geographic location and time of the lightning event.

14. A method for detecting lightning events proximal an aircraft, comprising:
   measuring a rate of change in magnetic field strength versus time that corresponds to a lightning event proximal an aircraft;
   determining whether the rate of change in magnetic field strength versus time is greater than a predetermined threshold;
   estimating a position, on the aircraft, of the change in magnetic field strength,
   recording the rate of change in magnetic field strength versus time and recording the position on the aircraft for post-flight analysis when said rate of change is greater than the predetermined threshold; and
   alerting a pilot of the aircraft of the lightning event corresponding to the rate of change in magnetic field strength versus time that is greater than the predetermined threshold.

15. The method of claim 14, wherein alerting the pilot comprises providing one of a visual alert and an audio alert of the lightning event to the pilot.

16. The method of claim 15, further including recording aircraft state data corresponding to a place and time of the lightning event.

* * * * *